(12) United States Patent
Osada et al.

(10) Patent No.: US 6,783,859 B2
(45) Date of Patent: Aug. 31, 2004

(54) SEMICONDUCTOR ENCAPSULATING FLAME RETARDANT EPOXY RESIN COMPOSITION AND SEMICONDUCTOR DEVICE

(75) Inventors: Shoichi Osada, Gunma-ken (JP); Shingo Ando, Gunma-ken (JP); Hiroyuki Takenaka, Gunma-ken (JP); Kazutoshi Tomiyoshi, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 15 days.

(21) Appl. No.: 10/358,188

(22) Filed: Feb. 5, 2003

(65) Prior Publication Data

US 2003/0152777 A1 Aug. 14, 2003

(30) Foreign Application Priority Data

Feb. 7, 2002 (JP) ........................................ 2002-030240

(51) Int. Cl.$^7$ ............................................... B32B 27/38
(52) U.S. Cl. ...................... 428/413; 523/452; 523/458; 524/95; 524/96; 524/115
(58) Field of Search ................................. 523/452, 458; 524/115, 95, 96; 428/413, 901; 438/127

(56) References Cited

U.S. PATENT DOCUMENTS

2003/0148107 A1 * 8/2003 Suzuki et al. ............... 428/413

FOREIGN PATENT DOCUMENTS

| JP | 7-157542 A | 6/1995 |
| JP | 10-259292 A | 9/1998 |
| JP | 2843244 B2 | 10/1998 |

OTHER PUBLICATIONS

Machine Translation, JP 2002–012741, Ito et al., Jan. 15, 2002.*

* cited by examiner

*Primary Examiner*—David J. Buttner
*Assistant Examiner*—Christopher Keehan
(74) *Attorney, Agent, or Firm*—Birch, Stewart, Kolasch & Birch, LLP.

(57) ABSTRACT

An epoxy resin composition comprising an epoxy resin, a phenolic resin curing agent, an inorganic filler, zinc molybdate on an inorganic support, and a complementary combination of two phosphazene compounds is effectively moldable, flame retardant and suitable for semiconductor encapsulation. A semiconductor device encapsulated with the cured epoxy resin composition is improved in flame retardance and moisture-proof reliability.

3 Claims, No Drawings

SEMICONDUCTOR ENCAPSULATING FLAME RETARDANT EPOXY RESIN COMPOSITION AND SEMICONDUCTOR DEVICE

This invention relates to a flame retardant epoxy resin composition for semiconductor encapsulation which is effectively moldable and cures into a product having flame retardance and moisture-proof reliability despite the absence of bromides (e.g., brominated epoxy resins) and antimony compounds (e.g., antimony trioxide). It also relates to a semiconductor device encapsulated with a cured product of the composition.

BACKGROUND OF THE INVENTION

The current mainstream of semiconductor devices resides in diodes, transistors, ICs, LSIs and VLSIs of the resin encapsulation type. Epoxy resins have superior moldability, adhesion, electrical properties, mechanical properties, and moisture resistance to other thermosetting resins. It is thus a common practice to encapsulate semiconductor devices with epoxy resin compositions. Semiconductor devices are now used in every area of the modern society, for example, in electric appliances and computers. As a guard against accidental fire, the semiconductor devices are required to be flame retardant.

In semiconductor encapsulating epoxy resin compositions, halogenated epoxy resins combined with antimony trioxide ($Sb_2O_3$) are often included in order to enhance flame retardance. This combination of a halogenated epoxy resin with antimony trioxide has great radical-trapping and air-shielding effects in the vapor phase, thus conferring a high fire-retarding effect.

However, the halogenated epoxy resins generate noxious gases during combustion, and antimony trioxide has powder toxicity. Given their negative impact on human health and the environment, it is desirable to entirely exclude these fire retardants from resin compositions.

In view of the above demand, studies have been conducted on the use of hydroxides such as $Al(OH)_3$ and $Mg(OH)_2$ or phosphorus based fire retardants such as red phosphorus and phosphates in place of halogenated epoxy resins and antimony trioxide. Unfortunately, various problems arise from the use of these alternative compounds. The hydroxides such as $Al(OH)_3$ and $Mg(OH)_2$ have less flame retardant effects and must be added in larger amounts in order that epoxy resin compositions be flame retardant. Then the viscosity of these compositions increases to a deleterious level to molding, causing molding defects such as voids and wire flow. On the other hand, the phosphorus-containing fire retardants such as red phosphorus and phosphates added to epoxy resin compositions can be hydrolyzed to generate phosphoric acid when the semiconductor devices are exposed to hot humid conditions. The phosphoric acid generated causes aluminum conductors to be corroded, detracting from reliability.

To solve these problems, Japanese Patent No. 2,843,244 proposes an epoxy resin composition using a flame retardant having red phosphorus coated with a surface layer of $Si_xO_y$ although it still lacks moisture-proof reliability. JP-A 10-259292 discloses an epoxy resin composition in which a cyclic phosphazene compound is used in an amount to give 0.2–3.0% by weight of phosphorus atoms based on the total weight of other constituents excluding the filler. To provide flame retardance, a substantial amount of the cyclic phosphazene compound must be added to the epoxy resin composition, which can cause ineffective cure and a lowering of electrical resistance in a high-temperature environment.

SUMMARY OF THE INVENTION

An object of the invention is to provide a flame retardant epoxy resin composition for semiconductor encapsulation which is effectively moldable and cures into a product having improved flame retardance and moisture-proof reliability despite the absence of bromides (e.g., brominated epoxy resins) and antimony compounds (e.g., antimony trioxide). Another object is to provide a semiconductor device encapsulated with the composition in the cured state.

We have found that a semiconductor encapsulating, flame retardant epoxy resin composition comprising (A) an epoxy resin, (B) a curing agent, (C) an inorganic filler, (D) a molybdenum ingredient having zinc molybdate supported on an inorganic filler, (E) a first phosphazene compound of the average compositional formula (1), and (F) a second phosphazene compound of the average compositional formula (2), shown below, as essential components, and substantially free of bromides and antimony compounds is effectively moldable and cures into a product having improved flame retardance and moisture-proof reliability. A semiconductor device encapsulated with the epoxy resin composition in the cured state is improved in flame retardance and moisture-proof reliability.

Accordingly, the present invention provides a semiconductor encapsulating, flame retardant epoxy resin composition comprising as essential components, (A) an epoxy resin, (B) a curing agent, (C) an inorganic filler, (D) a molybdenum ingredient having zinc molybdate supported on an inorganic filler, (E) a first phosphazene compound having the average compositional formula (1), and (F) a second phosphazene compound having the average compositional formula (2), the epoxy resin composition being substantially free of bromides and antimony compounds.

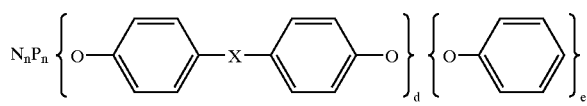

(1)

Herein X is a single bond or a group selected from among $CH_2$, $C(CH_3)_2$, $SO_2$, S, O, and $O(CO)O$, subscripts d, e and n are numbers satisfying $0 \leq d \leq 0.25n$, $0 \leq e < 2n$, $2d+e=2n$, and $3 \leq n \leq 1000$.

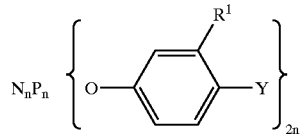

(2)

Herein Y is OH, SH or $NH_2$, $R^1$ is selected from among alkyl and alkoxy groups having 1 to 4 carbon atoms, $NH_2$, $NR^2R^3$ and $SR^2$, each of $R^2$ and $R^3$ is hydrogen or an alkyl group having 1 to 4 carbon atoms, and n is a number satisfying $3 \leq n \leq 1000$.

Also contemplated herein is a semiconductor device encapsulated with a cured product of the epoxy resin composition.

As stated above, the epoxy resin composition of the invention is substantially free of bromides and antimony compounds. Although brominated epoxy resins and antimony trioxide are generally included in conventional epoxy resin compositions in order to impart flame retardance thereto, the epoxy resin composition of the invention clears the flame retardant specifications, UL-94, V-0 without resorting to brominated epoxy resins and antimony trioxide.

In the prior art, studies were conducted on the use of hydroxides such as Al(OH)$_3$ and Mg(OH)$_2$ or phosphorus-based fire retardants such as red phosphorus and phosphates in place of the brominated epoxy resins and antimony trioxide. Unfortunately, these known alternative flame retardants have the common drawback that they are less resistant to water, especially at elevated temperatures, so that they are dissolved and decomposed to increase impurity ions in the extracting water. As a consequence, if semiconductor devices encapsulated with conventional flame retarded epoxy resin compositions substantially free of bromides and antimony compounds are kept in a hot humid environment for a long period of time, the aluminum conductors in the devices can be corroded, detracting from moisture-proof reliability.

Addressing the above concerns, we have discovered that a semiconductor encapsulating epoxy resin composition using as a flame retardant a combination of three components, (D) a molybdenum ingredient having zinc molybdate supported on an inorganic filler, (E) a first phosphazene compound of the average compositional formula (1), and (F) a second phosphazene compound of the average compositional formula (2) does not increase impurity ions in the extracting water, is effectively moldable and cures into a product having improved flame retardance and moisture-proof reliability. These three components of flame retardant are fully resistant to water and do not increase impurity ions in the extracting water. When these three components are used alone, there arises the problem that the epoxy resin composition is given insufficient flame retardant effects, loses flow or becomes less curable. The use of the above three components (D), (E) and (F) in combination as a flame retardant allows the amounts of the individual components added to be minimized, and thus eliminates the above-mentioned problems during molding. Then the flame retardant epoxy resin composition of the invention cures into a product having significantly improved flame retardance and moisture-proof reliability.

DETAILED DESCRIPTION OF THE INVENTION

Component (A) in the epoxy resin composition of the invention is an epoxy resin which is not critical. Illustrative examples of suitable epoxy resins include novolac type epoxy resins, cresol novolac type epoxy resins, triphenolalkane type epoxy resins, aralkyl type epoxy resins, biphenyl skeleton-containing aralkyl type epoxy resins, biphenyl type epoxy resins, dicyclopentadiene type epoxy resins, heterocyclic epoxy resins, naphthalene ring-containing epoxy resins, bisphenol A type epoxy compounds, bisphenol F type epoxy compounds, and stilbene type epoxy resins. These epoxy resins may be employed alone or in combination of two or more. Halogenated, especially brominated, epoxy resins are excluded.

The epoxy resin used herein preferably has a hydrolyzable chlorine content of up to 1,000 ppm, especially up to 500 ppm and sodium and potassium contents of up to 10 ppm for each. If the content of hydrolyzable chlorine is more than 1,000 ppm or if the content of sodium or potassium is more than 10 ppm, moisture resistance may degrade when the encapsulated semiconductor device is long held in a hot humid environment.

Component (B) is a curing agent which is not critical as well. Most often, phenolic resins are used as the curing agent. Illustrative examples of typical phenolic resin curing agents include phenolic novolac resins, naphthalene ring-containing phenolic resins, aralkyl type phenolic resins, triphenolalkane type phenolic resins, biphenyl skeleton-containing aralkyl type phenolic resins, biphenyl type phenolic resins, alicyclic phenolic resins, heterocyclic phenolic resins, and bisphenol-type phenolic resins such as bisphenol A and bisphenol F type phenolic resins. These phenolic resins may be employed alone or in combination of two or more.

Like the epoxy resin, the curing agent used herein preferably has sodium and potassium contents of up to 10 ppm for each. If the content of sodium or potassium is more than 10 ppm, moisture resistance may degrade when the encapsulated semiconductor device is long held in a hot humid environment.

The epoxy resin and the curing agent may be admixed in any desired proportion. Preferably they are used in such amounts that the molar ratio of phenolic hydroxyl groups in the curing agent and the second phosphazene compound of formula (2) to epoxy groups in the epoxy resin is from 0.5 to 1.5, more preferably from 0.8 to 1.2.

In the practice of the invention, a curing accelerator is preferably used to promote the curing reaction between the epoxy resin and the curing agent. The curing accelerator may be any suitable substance that promotes the curing reaction. Illustrative, non-limiting examples of curing accelerators that may be used include phosphorus compounds such as triphenylphosphine, tributylphosphine, tri(p-methylphenyl)phosphine, tri(nonylphenyl)phosphine, triphenylphosphine triphenylborane, and tetraphenylphosphine tetraphenylborate; tertiary amine compounds such as triethylamine, benzyldimethylamine, α-methylbenzyldimethyl-amine, and 1,8-diazabicyclo[5.4.0]undecene-7; and imidazole compounds such as 2-methylimidazole, 2-phenylimidazole, and 2-phenyl-4-methylimidazole.

The curing accelerator is blended in an effective amount to promote the curing reaction between the epoxy resin and the curing agent (typically phenolic resin), desirably in an amount of about 0.1 to 5 parts, more desirably about 0.5 to 2 parts by weight per 100 parts by weight of components (A), (B), (E) and (F) combined, independent of whether it is a phosphorus compound, tertiary amine compound or imidazole compound as stated above.

The inorganic filler (C) included in the epoxy resin compositions of the invention may be any suitable inorganic filler commonly used in epoxy resin compositions. Illustrative examples include silicas such as fused silica and crystalline silica, alumina, silicon nitride, aluminum nitride, boron nitride, titanium oxide, and glass fibers.

No particular limit is imposed on the mean particle size and shape of these inorganic fillers as well as the amount thereof. To enhance the flame retardance, the inorganic filler is preferably contained in the epoxy resin composition in a larger amount insofar as this does not compromise moldability. With respect to the mean particle size and shape of the inorganic filler, spherical fused silica having a mean particle size of 5 to 30 μm is especially preferred. The amount of the inorganic filler (C) loaded is preferably 400 to 1,200 parts, more preferably 500 to 1,000 parts by weight per 100 parts by weight of components (A), (B), (E) and (F) combined.

The inorganic filler used herein is preferably surface treated beforehand with a coupling agent such as a silane coupling agent or a titanate coupling agent in order to increase the bonding strength between the resin and the inorganic filler. The preferred coupling agents are silane coupling agents including epoxy silanes such as γ-glycidoxy-propyltrimethoxysilane, γ-glycidoxypropylmethyldiethoxy-silane, and β-(3,4-epoxycyclohexyl)ethyltrimethoxysilane; amino silanes such as N-β-(aminoethyl)-γ-aminopropyl-trimethoxysilane, γ-aminopropyltriethoxysilane, and N-phenyl-γ-aminopropyltrimethoxysilane; and mercapto silanes such as γ-mercaptosilane. No particular limitation is imposed on the amount of coupling agent used for surface treatment or the method of surface treatment.

The epoxy resin composition of the invention contains (D) a molybdenum ingredient having zinc molybdate supported on an inorganic filler as a flame retardant.

To develop satisfactory flame retarding effects, zinc molybdate should preferably be uniformly dispersed in the epoxy resin composition. For improving the dispersion, the molybdenum ingredient having zinc molybdate previously supported on an inorganic filler such as silica or talc is optimum.

Suitable inorganic fillers on which zinc molybdate is supported include silicas such as fused silica and crystalline silica, talc, alumina, silicon nitride, aluminum nitride, boron nitride, titanium oxide, zinc oxide, and glass fibers. The inorganic filler should preferably have a mean particle size of 0.1 to 40 μm, and more preferably 0.5 to 15 μm and a specific surface area of 0.5 to 50 m²/g, and more preferably 0.7 to 10 m²/g. It is noted that the mean particle size can be determined as the weight average value or median diameter by the laser light diffraction technique, for example, and the specific surface area is determined by the BET adsorption method, for example.

In the molybdenum ingredient having zinc molybdate supported on the inorganic filler, the content of zinc molybdate is preferably 5 to 40% by weight, more preferably 10 to 30% by weight. Less contents of zinc molybdate may fail to provide satisfactory flame retardance whereas excessive contents may detract from flow during molding and curability.

The molybdenum ingredient in the form of zinc molybdate on inorganic filler is commercially available under the trade name of KEMGARD 1260, 1261, 911B and 911C from Sherwin-Williams Co.

An appropriate amount of the molybdenum ingredient blended is 3 to 100 parts, more preferably 5 to 50 parts by weight per 100 parts by weight of components (A), (B), (E) and (F) combined. Less than 3 parts of the molybdenum ingredient may fail to provide satisfactory flame retardance whereas more than 100 parts may detract from flow and curability.

The molybdenum ingredient comprising zinc molybdate supported on inorganic filler is added in such amounts that 0.1 to 20 parts, especially 0.2 to 20 parts by weight of zinc molybdate is present per 100 parts by weight of the epoxy resin and the curing agent combined. Less than 0.1 part by weight of zinc molybdate may fail to provide satisfactory flame retardance whereas more than 20 parts by weight of zinc molybdate may detract from flow and curability.

Included in the semiconductor encapsulating, flame retardant epoxy resin composition of the invention are (E) a first phosphazene compound and (F) a second phosphazene compound.

The first phosphazene compound (E) has the average compositional formula (1):

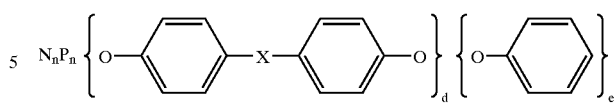

wherein X is a single bond or a group selected from among $CH_2$, $C(CH_3)_2$, $SO_2$, S, O, and $O(CO)O$, subscripts d, e and n are numbers satisfying $0 \leq d \leq 0.25n$, $0 \leq e < 2n$, $2d+e=2n$, and $3 \leq n \leq 1000$.

As compared with epoxy resin compositions having phosphorus base flame retardants (e.g., red phosphorus and phosphates) added, the semiconductor encapsulating, flame retardant epoxy resin composition of the invention having the first phosphazene compound of formula (1) added affords a cured product having resistance to hot water extraction and especially, high moisture-proof reliability. The use of the phosphazene compound of formula (1) in combination with the molybdenum ingredient achieves more enhanced flame retarding effects.

In formula (1), n is in the range of 3 to 1000, preferably 3 to 10. For synthesis, n=3 is most preferred.

The proportion of d and e is to satisfy $0 \leq d \leq 0.25n$, $0 \leq e < 2n$, and $2d+e=2n$. If $0.25n<d$, then the phosphazene compound has a higher softening point due to more intermolecular crosslinks, and thus becomes less miscible with the epoxy resin, failing to achieve the desired flame retarding effects. The proportion of d is preferably $0.015n \leq d \leq 0.25n$. The proportion of e is $0 \leq e < 2n$, and $1.5n \leq e \leq 1.97n$ is desired to achieve a higher level of flame retardance without compromising other desired properties.

It is understood that when X is a single bond,

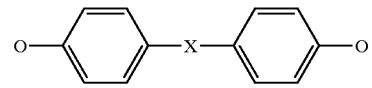

is represented as

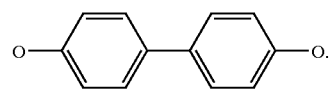

The second phosphazene compound (F) has the average compositional formula (2):

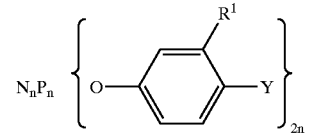

wherein Y is OH, SH or $NH_2$, $R^1$ is selected from among alkyl and alkoxy groups having 1 to 4 carbon atoms, $NH_2$, $NR^2R^3$ and $SR^2$, each of $R^2$ and $R^3$ is hydrogen or an alkyl group having 1 to 4 carbon atoms, and n is a number satisfying $3 \leq n \leq 1000$.

In formula (2), $R^1$ is selected from among alkyl and alkoxy groups having 1 to 4 carbon atoms, $NH_2$, $NR^2R^3$ and $SR^2$. If $R^1$ is an alkyl or alkoxy group having more than 4 carbon atoms, the flame retarding effects achieved with this compound decline as the number of carbon atoms increases. The same applies to $R^2$ and $R^3$. For this reason or other, $R^1$ is preferably methyl, methoxy, amino or dimethylamino.

The first phosphazene compound of the average compositional formula (1) exerts good flame retarding effects. However, due to the lack of reactive groups, as the addition amount thereof is increased, it can detract from curability and electrical properties at elevated temperatures. On the other hand, the second phosphazene compound of the average compositional formula (2) has positive effects on cure and electrical properties at elevated temperatures due to the inclusion of substituent groups capable of reaction with the epoxy resin. However, once it has reacted with the epoxy resin, it is taken into the matrix and kept substantially immobile, sometimes failing to achieve the desired flame retarding effects upon burning. It has been found that in order to meet all the requirements of flame retardance, cure and electrical properties, the first and second phosphazene compounds (E) and (F) are preferably mixed in a ratio E/F between 50/50 and 90/10, especially between 50/50 and 80/20, as expressed by a weight ratio of phosphorus atoms contained in the respective compounds.

The total amount of the first and second phosphazene compounds added, that is, the amount of components (E) and (F) combined is preferably 1 to 50% by weight, more preferably 2 to 20% by weight based on the total weight (100% by weight) of components (A), (B), (E) and (F) combined. Less than 1% by weight of the phosphazene compounds may fail to provide the desired flame retarding effects whereas more than 50% by weight of the phosphazene compounds may detract from fluidity. The content of phosphorus in the phosphazene compounds, i.e., components (F) and (F) is preferably 0.05 to 7% by weight, more preferably 0.1 to 2% by weight, based on the entire epoxy resin composition.

The semiconductor encapsulating, flame retardant epoxy resin composition of the invention may further include other flame retardants, for example, hydroxides such as aluminum hydroxide and magnesium hydroxide, inorganic compounds such as zinc borate and zinc stannate, and silicone compounds as long as the objects and benefits of the invention are not impaired. Note that antimony compounds such as antimony trioxide are excluded.

The inventive epoxy resin composition may also include various additives, if necessary and as long as the objects of the invention are not impaired. Illustrative examples include stress-lowering additives such as thermoplastic resins, thermoplastic elastomers, synthetic organic rubbers, and silicones; waxes such as carnauba wax, higher fatty acids and synthetic waxes; colorants such as carbon black; and halogen trapping agents.

The inventive epoxy resin compositions may be prepared as a molding material by compounding the epoxy resin, curing agent, inorganic filler, molybdenum ingredient, phosphazene compounds, and optional additives in predetermined proportions, thoroughly mixing these components together in a mixer or other appropriate apparatus, then melting and working the resulting mixture using a hot roll mill, kneader, extruder or the like. The worked mixture is then cooled and solidified, and subsequently ground to a suitable size so as to give a molding material.

The resulting epoxy resin compositions of the invention can be effectively used for encapsulating various types of semiconductor devices. The method of encapsulation most commonly used is low-pressure transfer molding. The epoxy resin composition of the invention is preferably molded at a temperature of about 150 to 180° C. for a period of about 30 to 180 seconds, followed by post-curing at about 150 to 180° C. for about 2 to 16 hours.

The semiconductor encapsulating, flame retardant epoxy resin compositions of the invention are effectively molded and cure into products which have excellent flame retardance and reliability against moisture. The compositions have no ill effects on human health and the environment because they do not contain bromides such as brominated epoxy resins and antimony compounds such as antimony trioxide. The semiconductor devices encapsulated with the cured epoxy resin compositions of the invention remain fully flame retardant and reliable against moisture and are thus of great worth in the industry.

EXAMPLE

Examples of the invention and comparative examples are given below together with synthesis examples of phosphazene compounds, for further illustrating the invention, but are not intended to limit the invention. All parts are by weight. Me is methyl.

Synthesis Example A

In a nitrogen atmosphere and at 0° C., 4.8 g (119 mmol) of sodium hydride was suspended in 50 ml of THF. To the suspension, a solution of 10.2 g (108 mmol) phenol and 0.45 g (1.8 mmol) 4,4'-sulfonyldiphenol in 50 ml THF was added dropwise. After 30 minutes of stirring, a solution of 12.5 g (36.0 mmol) hexachlorotriphosphazene in 50 ml THF was added dropwise, and the resulting solution was heated under reflux for 5 hours. To this solution, a suspension of 5.2 g (130 mmol) of sodium hydride in 50 ml of THF at 0° C. was added, and a solution of 11.2 g (119 mmol) phenol in 50 ml THF was added dropwise, followed by 19 hours of heating under reflux. The solvent was distilled off in vacuum, after which chlorobenzene was added to the residue for dissolution. The solution was extracted with 2×200 ml of a 5% NaOH aqueous solution, 2×200 ml of a 5% sulfuric acid aqueous solution, 2×200 ml of a 5% sodium hydrogen carbonate aqueous solution, then 2×200 ml of water. The solvent was distilled off in vacuum, leaving 20.4 g of a yellowish brown crystal, designated Phosphazene A of the formula shown below, having a phosphorus atom content of 13.36% by weight.

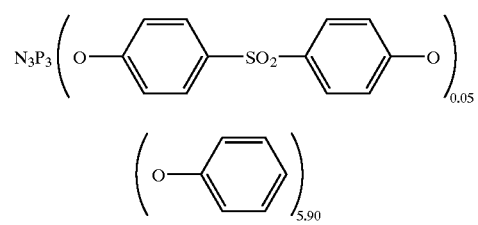

Synthesis Example B

In a nitrogen atmosphere and at room temperature, 68.3 g (733 mmol) of γ-picoline was added dropwise to a mixture of 25.5 g (73 mmol) of hexachlorotriphosphazene, 121.8 g (733 mmol) of methylhydroquinone and 900 ml of cyclohexane. This was heated under reflux for 4 hours. The reaction solution was separated by decantation, and the lower layer in the form of yellow syrup was dissolved in 160 ml of 80% acetic acid, which was transferred to 500 ml of water whereupon crystals precipitated. The crystals were dissolved in methanol and transferred to water whereupon crystals precipitated again. This procedure was repeated until the water became neutral. There was obtained 68.2 g of a pale brown crystal, designated Phosphazene B of the formula shown below, having a phosphorus atom content of 10.65% by weight.

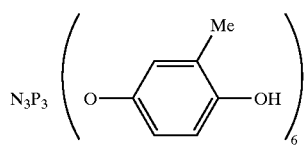

Examples 1–2 & Comparative Examples 1–4

Epoxy resin compositions for semiconductor encapsulation were prepared by uniformly melt mixing the components shown in Table 1 in a hot twin-roll mill, followed by cooling and grinding. These compositions had a phosphorus atom content as shown in Table 2. Properties of these compositions were measured by the following methods. The results are shown in Table 3.

(i) Spiral Flow

Measured by molding at 175° C. and 6.9 N/mm² for a molding time of 120 seconds using a mold in accordance with EMMI standards.

(ii) Gel Time

The gel time was measured as the time until the epoxy resin composition gelled on a hot plate at 175° C.

(iii) Hardness when Molded

In accordance with JIS-K6911, a rod measuring 10×4×100 mm was molded from the epoxy resin composition at a temperature of 175° C. and a pressure of 6.9 N/mm² for a time of 90 seconds. The hardness when hot was measured with a Barcol Impressor.

(iv) Electric Resistance at High Temperature

A disk having a diameter of 70 mm and a thickness of 3 mm was molded from the epoxy resin composition at a temperature of 175° C. and a pressure of 6.9 N/mm² for a time of 120 seconds and post-cured for 4 hours at 180° C. The volume resistivity of the disk was measured in a 150° C. atmosphere.

(v) Flame Retardance

A sheet of 1.5875 mm (1/16 inch) thick was molded and its flame retardance was rated in accordance with UL-94 burning test specifications.

(vi) Moisture Resistance

A silicon chip measuring 6×6 mm on which aluminum wiring had been formed was adhesively bonded to a 14-pin dual in-line package (DIP) frame (Alloy 42), and the aluminum electrodes on the chip surface were wire bonded to the lead frame using gold wire having a diameter of 30 μm. The epoxy resin composition was then molded over the chip at a temperature of 175° C. and a pressure of 6.9 N/mm² for a time of 120 seconds, and post-cured at 180° C. for 4 hours. Twenty packages thus obtained were left to stand for 500 hours in an atmosphere of 140° C. and RH 85% while being subjected to a bias voltage of −5V DC. The number of packages in which aluminum corrosion arose was counted.

(vii) Reliability on High-Temperature Storage

A silicon chip measuring 6×6 mm on which aluminum wiring had been formed was adhesively bonded to a 14-pin dual in-line package (DIP) frame (Alloy 42), and the aluminum electrodes on the chip surface were wire bonded to the lead frame using gold wire having a diameter of 30 μm. The epoxy resin composition was then molded over the chip at a temperature of 175° C. and a pressure of 6.9 N/mm² for a time of 120 seconds, and post-cured at 180° C. for 4 hours. Twenty packages thus obtained were left to stand for 500 hours in an atmosphere of 200° C. The cured resin was dissolved away using fuming nitric acid whereby the packages were unsealed. The tensile strength of gold wire was measured. Those samples in which the tensile strength after the test decreased below 70% of the initial value are rejected. The number of rejected samples per 20 samples is reported.

TABLE 1

| Formulation (pbw) | Example 1 | Example 2 | Comparative Example 1 | Comparative Example 2 | Comparative Example 3 | Comparative Example 4 |
|---|---|---|---|---|---|---|
| Epoxy resin | 60.5 | 63.6 | 54 | 62 | 59.8 | 70 |
| Curing agent | 30 | 26 | 38 | 38 | 31 | 18.5 |
| Molybdenum ingredient | 5 | 5 | | | | 5 |
| Phosphazene A | 8.3 | 4.7 | | | 9.2 | |
| Phosphazene B | 1.2 | 5.7 | | | | 11.5 |
| Red phosphorus | | | | 2 | | |
| Brominated epoxy resin | | | 8 | | | |
| Sb₂O₃ | | | 10 | | | |
| Inorganic filler | 600 | 600 | 600 | 600 | 600 | 600 |
| Curing catalyst | 1.0 | 1.0 | 1.0 | 1.0 | 1.0 | 1.0 |
| Parting agent | 1.5 | 1.5 | 1.5 | 1.5 | 1.5 | 1.5 |
| Carbon black | 1.5 | 1.5 | 1.5 | 1.5 | 1.5 | 1.5 |
| Silane coupling agent | 1.0 | 1.0 | 1.0 | 1.0 | 1.0 | 1.0 |

Epoxy resin: o-cresol novolac epoxy resin: EOCN 1020–55 by Nippon Kayaku K.K. (epoxy equivalent 200)
Curing agent: phenol novolac resin: DL-92 by Meiwa Kasei K.K. (phenolic hydroxyl equivalent 110)
Molybdenum ingredient: Zinc molybdate on inorganic filler, KEMGARD 911C by Sherwin-Williams Co. (zinc molybdate content 18 wt %, inorganic filler: talc with a mean particle size 2.0 μm and a specific surface area 2.0 m²/g)
Inorganic filler: Spherical fused silica (mean particle size 20 μm) by Tatsumori K.K.
Curing catalyst: triphenyl phosphine by Hokko Chemical K.K.
Parting agent: Carnauba wax by Nikko Fine Products K.K.
Carbon black: Denka Black by Denki Kagaku Kogyo K.K.
Silane coupling agent: KBM403 (γ-glycidoxypropyltrimethoxysilane) by Shin-Etsu Chemical Co., Ltd.

TABLE 2

| | Example 1 | Example 2 | Comparative Example 1 | Comparative Example 2 | Comparative Example 3 | Comparative Example 4 |
|---|---|---|---|---|---|---|
| P atom content from Phosphazene A (pbw) | 1.11 | 0.63 | — | — | 1.23 | — |
| P atom content from Phosphazene B (pbw) | 0.13 | 0.61 | — | — | — | 1.23 |
| P atom weight ratio of Phosphazene A/B | 50.84:49.16 | 89.66:10.34 | — | — | 100:0 | 0:100 |
| Total P atom in composition (wt %) | 0.17 | 0.17 | — | — | 0.17 | 0.17 |

TABLE 3

| Tests | Example 1 | Example 2 | Comparative Example 1 | Comparative Example 2 | Comparative Example 3 | Comparative Example 4 |
|---|---|---|---|---|---|---|
| Spiral flow (cm) | 83 | 80 | 83 | 85 | 88 | 25 |
| Gel time (sec) | 19 | 18 | 19 | 19 | 20 | 21 |
| Hardness when molded | 84 | 90 | 84 | 80 | 65 | 90 |
| Electric resistance at high temperature (GΩ-m) | 55 | 98 | 55 | 8 | 0.1 | 120 |
| Flame retardance | V-0 | V-0 | V-0 | V-0 | V-0 | burned |
| Moisture resistance | 0/20 | 0/20 | 0/20 | 20/20 | 0/20 | 0/20 |
| Reliability on high-temperature storage | 0/20 | 0/20 | 20/20 | 0/20 | 0/20 | 0/20 |

It is evident from Table 3 that the semiconductor encapsulating epoxy resin compositions of the invention are able to cure into products which have excellent flame retardance and reliability against moisture as well as high-temperature electric resistance. The semiconductor devices encapsulated with the inventive epoxy resin compositions remain fully flame retardant and reliable against moisture. The compositions have no ill effects on human health and the environment because they contain no bromides such as brominated epoxy resins or antimony compounds such as antimony trioxide.

Japanese Patent Application No. 2002-030240 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor encapsulating, flame retardant epoxy resin composition comprising as essential components,
   (A) an epoxy resin,
   (B) a curing agent,
   (C) an inorganic filler,
   (D) a molybdenum ingredient having zinc molybdate supported on an inorganic filler,
   (E) a first phosphazene compound having the average compositional formula (1):

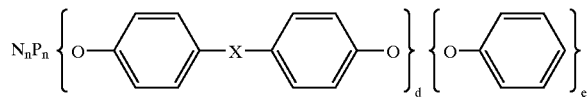

(1)

wherein X is a single bond or a group selected from among $CH_2$, $C(CH_3)_2$, $SO_2$, S, O, and $O(CO)O$, subscripts d, e and n are numbers satisfying $0 \leq d \leq 0.25n$, $0 \leq e < 2n$, $2d+e=2n$, and $3 \leq n \leq 1000$, and (F) a second phasphazene compound having the average compositional formula (2):

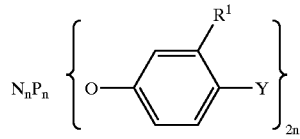

(2)

wherein Y is OH, SH or $NH_2$, $R^1$ is selected from among alkyl and alkoxy groups having 1 to 4 carbon atoms, $NH_2$, $NR^2R^3$ and $SR^2$, each of $R^2$ and $R^3$ is hydrogen or an alkyl group having 1 to 4 carbon atoms, and n is a number satisfying $3 \leq n \leq 1000$, said epoxy resin composition being substantially free of bromides and antimony compounds.

2. The epoxy resin composition of claim 1 wherein the first phosphazene compound (E) and the second phosphazene compound (F) are present in a ratio between 50:50 and 90:10 as expressed by a weight ratio of phosphorus atoms contained in the respective compounds.

3. A semiconductor device encapsulated with a cured product of the epoxy resin composition of claim 1.

* * * * *